(12) United States Patent
Hatakeyama et al.

(10) Patent No.: US 7,863,580 B2
(45) Date of Patent: Jan. 4, 2011

(54) ELECTRON BEAM APPARATUS AND AN ABERRATION CORRECTION OPTICAL APPARATUS

(75) Inventors: Masahiro Hatakeyama, Tokyo (JP); Takeshi Murakami, Tokyo (JP); Nobuharu Noji, Tokyo (JP); Mamoru Nakasuji, Tokyo (JP); Hirosi Sobukawa, Tokyo (JP); Satoshi Mori, Tokyo (JP); Tsutomu Karimata, Tokyo (JP); Yuichiro Yamazaki, Tokyo (JP); Ichirota Nagahama, Tokyo (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 11/760,235

(22) Filed: Jun. 8, 2007

(65) Prior Publication Data

US 2008/0067377 A1   Mar. 20, 2008

(30) Foreign Application Priority Data

Jun. 13, 2006   (JP) .............................. 2006-162948

(51) Int. Cl.
*G21K 1/08* (2006.01)
*H01J 3/14* (2006.01)
*H01J 3/26* (2006.01)

(52) U.S. Cl. .................. 250/396 R; 250/305; 250/307; 250/310; 250/311; 250/396 ML

(58) Field of Classification Search ................. 250/305, 250/307, 310, 311, 396 R, 396 ML
See application file for complete search history.

(56) References Cited

U.S. PATENT DOCUMENTS 4,779,046 A   10/1988   Rouberoi et al.

(Continued)

FOREIGN PATENT DOCUMENTS

JP   9-270241 A   10/1997
JP   11-67139 A   3/1999

(Continued)

OTHER PUBLICATIONS

Rose, H.; "Inhomogeneous Wien filter as a corrector compensating for the chromatic and spherical aberration of low-voltage electron microscopes."; Optik, (1990), pp. 91-107, vol. 84, No. 3.

(Continued)

*Primary Examiner*—David A Vanore
(74) *Attorney, Agent, or Firm*—Westerman, Hattori, Daniels & Adrian, LLP

(57) ABSTRACT

An electron beam apparatus for providing an evaluation of a sample, such as a semiconductor wafer, that includes a micro-pattern with a minimum line width not greater than 0.1 μm with high throughput. A primary electron beam generated by an electron gun is irradiated onto a sample and secondary electrons emanating from the sample are formed into an image on a detector by an image projection optical system. An electron gun 61 has a cathode 1 and a drawing electrode 3, and an electron emission surface 1a of the cathode defines a concave surface. The drawing electrode 3 has a convex surface 3a composed of a partial outer surface of a second sphere facing the electron emission surface 1a of the cathode and an aperture 73 formed through the convex surface for passage of the electrons. An aberration correction optical apparatus comprises two identically sized multi-polar Wien filters arranged such that their centers are in alignment with a ¼ plane position and a ¾ plane position, respectively, along an object plane-image plane segment in the aberration correction optical apparatus, and optical elements having bidirectional focus disposed in an object plane position, an intermediate image-formation plane position and an image plane position, respectively, in the aberration correction optical apparatus.

8 Claims, 13 Drawing Sheets

U.S. PATENT DOCUMENTS

| | | | |
|---|---|---|---|
| 4,962,313 A * | 10/1990 | Rose | 250/311 |
| 5,084,622 A * | 1/1992 | Rose | 250/396 R |
| 5,763,893 A * | 6/1998 | Nakasuji | 250/492.2 |
| 6,043,491 A | 3/2000 | Ose et al. | |
| 6,111,253 A * | 8/2000 | Tsuno | 250/311 |
| 6,191,423 B1 * | 2/2001 | Krijn et al. | 250/396 R |
| 6,310,341 B1 | 10/2001 | Todokoro et al. | |
| 6,329,659 B1 * | 12/2001 | Krijn et al. | 250/396 R |
| 6,462,474 B1 * | 10/2002 | Symons | 315/3 |
| 6,465,797 B2 * | 10/2002 | Okunuki | 250/492.3 |
| 6,479,819 B1 * | 11/2002 | Hamashima et al. | 250/310 |
| 6,509,569 B1 | 1/2003 | Frosien | |
| 6,580,073 B2 * | 6/2003 | Plies et al. | 250/305 |
| 6,608,308 B1 * | 8/2003 | Takagi et al. | 250/311 |
| 6,635,891 B1 | 10/2003 | Nakano et al. | |
| 6,661,008 B2 * | 12/2003 | Takagi et al. | 850/9 |
| 6,770,887 B2 * | 8/2004 | Krivanek et al. | 250/396 R |
| 6,784,437 B2 | 8/2004 | Rose | |
| 6,844,548 B2 * | 1/2005 | Lopez et al. | 250/305 |
| 6,855,929 B2 * | 2/2005 | Kimba et al. | 850/9 |
| 6,924,488 B2 * | 8/2005 | Matsuya et al. | 250/396 R |
| 6,992,290 B2 * | 1/2006 | Watanabe et al. | 250/310 |
| 7,012,262 B2 | 3/2006 | Rose | |
| 7,223,973 B2 * | 5/2007 | Kimba et al. | 250/307 |
| 7,282,727 B2 * | 10/2007 | Retsky | 250/492.3 |
| 7,321,124 B2 | 1/2008 | Rose | |
| 7,351,969 B2 * | 4/2008 | Watanabe et al. | 250/310 |
| 7,408,175 B2 * | 8/2008 | Kimba et al. | 250/441.11 |
| 7,465,939 B2 * | 12/2008 | Frosien | 250/396 R |
| 7,569,838 B2 * | 8/2009 | Watanabe et al. | 250/428 |
| 2002/0148961 A1 | 10/2002 | Nakasuji et al. | |
| 2003/0085353 A1 | 5/2003 | Almogy et al. | |
| 2003/0122076 A1 | 7/2003 | Matsuya et al. | |
| 2003/0207475 A1 | 11/2003 | Nakasuji et al. | |
| 2004/0108457 A1 | 6/2004 | Kienzle et al. | |
| 2004/0159787 A1 | 8/2004 | Nakasuji et al. | |
| 2004/0188635 A1 | 9/2004 | Kawasaki et al. | |
| 2005/0253066 A1 | 11/2005 | Watanabe et al. | |
| 2007/0228922 A1 * | 10/2007 | Nakasuji | 313/364 |
| 2008/0173814 A1 * | 7/2008 | Watanabe et al. | 250/310 |
| 2008/0308729 A1 * | 12/2008 | Kimba et al. | 250/307 |
| 2009/0014649 A1 | 1/2009 | Nakasuji et al. | |
| 2009/0212213 A1 * | 8/2009 | Nakasuji et al. | 250/310 |

FOREIGN PATENT DOCUMENTS

| | | |
|---|---|---|
| JP | 11-233062 A | 8/1999 |
| JP | 11-238484 A | 8/1999 |
| JP | 2001-148227 A | 5/2001 |
| JP | 2001-513254 A | 8/2001 |
| JP | 2001-291482 A | 10/2001 |
| JP | 2002-367552 A | 12/2002 |
| JP | 2003-157785 A | 5/2003 |
| JP | 2003-173756 A | 6/2003 |
| JP | 2003-187731 A | 7/2003 |
| JP | 2003-234078 A | 8/2003 |
| JP | 2004-87460 A | 3/2004 |
| JP | 2004-165146 A | 6/2004 |
| JP | 2004-214044 A | 7/2004 |
| JP | 2004-235225 A | 8/2004 |
| JP | 2004-303547 A | 10/2004 |
| JP | 2004-335190 A | 11/2004 |
| JP | 2004-342341 A | 12/2004 |
| JP | 2005-197121 A | 7/2005 |
| WO | 99-33085 A1 | 7/1999 |
| WO | 02/37527 A1 | 5/2002 |
| WO | 2005/024890 A1 | 3/2005 |

OTHER PUBLICATIONS

Tsuno, K.; "Negative aberrations generated by a Wien-type multipole corrector"; Japan Society for the Promotion of Science, Jul. 29, 2005, pp. 39-46.

Ioanoviciu, D. et al.; "Third order aberration theory of double Wien filters"; Review of Scientific Instruments, Nov. 2004, pp. 4434-4441, vol. 75, No. 11.

Tsuno K. et al.; "Third-order aberration theory of Wien filters for momchromators and aberration correctors"; Journal of Microscopy, Mar. 2005, pp. 205-215, vol. 217, Pt. 3.

International Search Report of PCT/JP2006/305688 dated Jul. 4, 2006.

International Search Report of PCT/JP2006/304088 dated May 30, 2006.

International Search Report of PCT/JP2006/304088, date of mailing May 30, 2006.

International Search Report of PCT/JP2006/314571, date of mailing Oct. 10, 2006.

* cited by examiner (a)

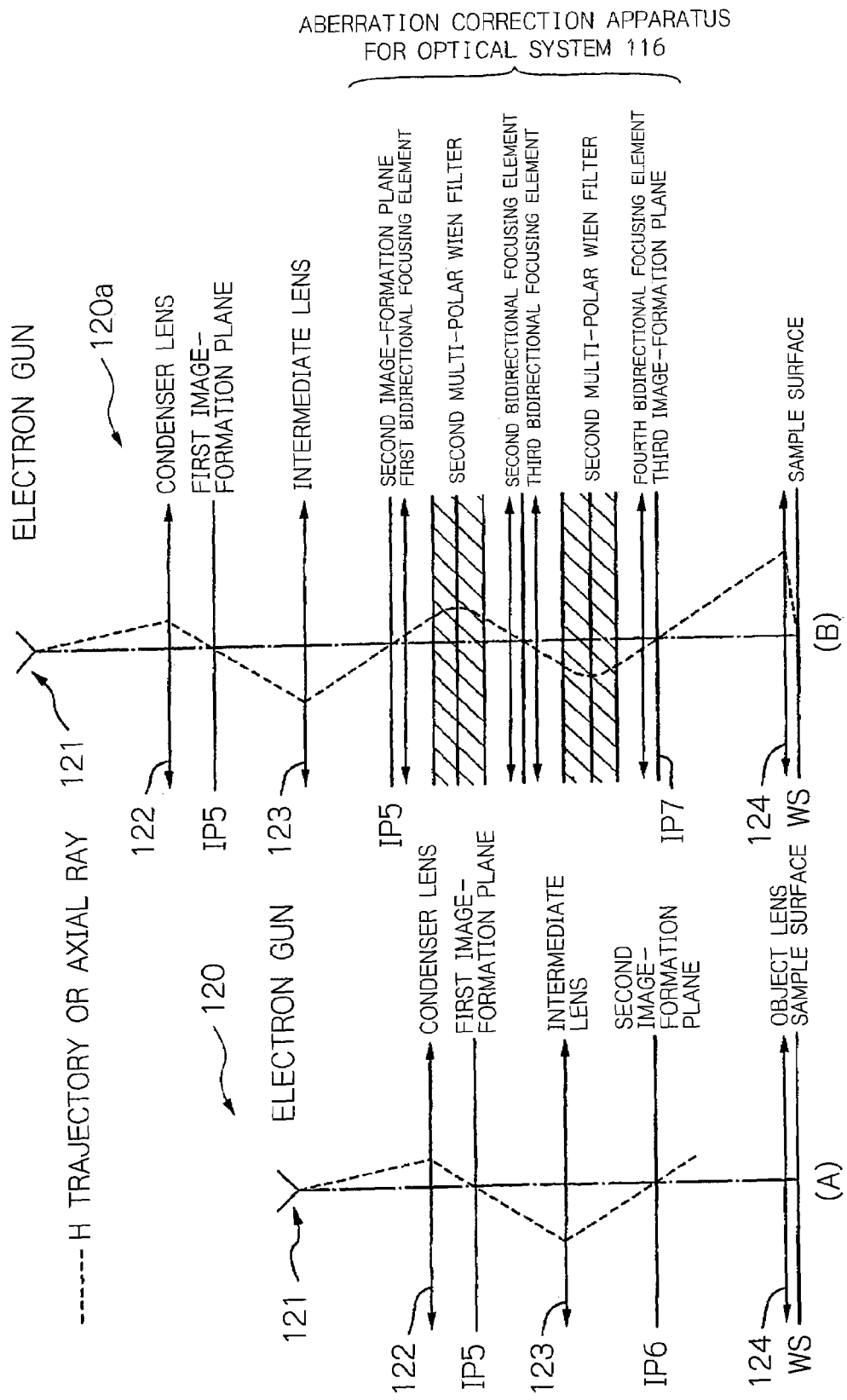

ELECTRON BEAM APPARATUS AND AN ABERRATION CORRECTION OPTICAL APPARATUS

BACKGROUND OF THE INVENTION

1. Technical Field

The present invention relates to an electron beam apparatus for providing an evaluation of a sample, such as a semiconductor wafer, that has a pattern with a minimum line width not greater than 0.1 μm with a high throughput, and further to an electron beam apparatus for irradiating a sample (i.e., a target), such as a part of a semiconductor wafer, with an electron beam having a large current density.

The present invention also relates to an aberration correction optical apparatus for a charged particle beam optical system, and more specifically, to an aberration correction optical apparatus comprising a plurality of multi-polar Wien filters and operable to compensate for an aberration in an optical system using a charged particle beam, such as an electron beam, as well as to an image projection optical system and a scanning type optical system, both of which are incorporated with the same apparatus.

2. Background Art

In a conventional electron beam apparatus using an image projection optical system, irradiation of a sample has been provided with a beam from an electron gun having a flat cathode defined by a planar surface for an electron beam emission or a convex shaped cathode defined by a convex shaped surface for the electron beam emission. In addition, a conventional electron gun for generating an X-ray has been designed and manufactured by employing a Pierce type electron gun (i.e., a specific type of electron gun made with a triode configuration composed of a cathode, Wehnelt and an anode).

Technology for compensating for the aberration in the optical system employing the Wien filter used with the charged particle beam including the electron beam have been already presented, as disclosed in the following cited documents 1 to 4. Among those, the cited document 1 has disclosed a method in which the Wien filter is operated under bidirectional focusing and nondispersive condition by overlapping a dipole and a quadrupole types of orthogonally intersecting electric and magnetic fields, and in which brightness of the quadrupolar electric and magnetic fields may be controlled so as to induce a spherical aberration and an axial chromatic aberration of equivalent amounts but of an opposite sign to those generated by an optical system employed to thereby cancel those aberrations introduced by the employed optical system. According to this method, in order to prevent any second-order geometric aberrations from being newly introduced by a corrector, it is effective for both H-trajectory and G-trajectory to take a symmetric or an anti-symmetric trajectory relative to ½ plane of a corrector optical trajectory length and again to take an anti-symmetric or a symmetric trajectory relative to ¼, ¾ plane of the corrector optical trajectory length, and taking such a trajectory defining double symmetry can also inhibit any chroma of third-order or magnification scale chromatic aberration of first-order from being newly introduced.

On the other hand, the inventions as disclosed in the cited documents 2 to 4 are directed to a method, which allows for conditioning the chromatic aberration to appear in a round shape independently from directions and also conditioning a shape of the third-order aberration to appear in a circular shape, by overlapping a hexapole and an octopole types of orthogonally intersecting electric and magnetic fields, in addition to those from the dipole and the quadrupole types.

LIST OF PATENT DOCUMENTS

[Non-Patent Document 1]
Research paper by H. Rose, "Inhomogeneous Wien filter as a corrector compensating for the chromatic and spherical aberration of low-voltage electron microscope", Optic, 84, pp. 91-107, (1990)

[Non-Patent Document 2]
Research paper by Tsuno, "How to produce a negative aberration from the viewpoint of Wien-type multi-pole", Japan Society for the Promotion of Science (independent corporation), Industrial Application of Charged Particle Beam No. 132 Committee, No. 169 Workshop Material, pp. 39-46, (2005)

[Non-Patent Document 3]
Research paper by D. Ioanoviciu, K. Tsuno and G. Martinez, "Third order aberration theory of double Wien filters" REVIEW OF SCIENTIFIC INSTRUMENTS, 75, pp. 4434-4441

[Non-Patent Document 4]
Research paper by K. Tsuno, D. Ioanoviciu and G. Martinez, "Third-order aberration theory of Wien filters for monochromators and aberration correctors", Journal of Microscopy, 217, pp. 205-215, (2005)

DISCLOSURE OF THE INVENTION

An electron beam apparatus using an image projection optical system requires a large flow of a primary electron beam. In this circumstance, the primary electron beam could result in a significantly blurred focus due to the space charge effect. To minimize the blurred focus of the primary beam caused by the space charge effect, an electron gun characterized by a lower brightness and a higher emittance, or (crossover diameter)×(beam emission angle) is required. In addition, it has been difficult with an electron gun constructed with a Pierce type electron gun for a purpose of generating an X-ray to converge the beams to achieve a current density of 500 A/cm$^2$ or higher. The present invention has been made to solve the above-pointed problems and an object thereof is to provide an electron gun allowing for the low brightness and high emittance as well as an electron gun for producing a large-current narrowly converged primary electron beam.

All of the conventional techniques described above are based on such a condition that a filter length, L1, is equal to an object plane-image plane distance (i.e., a distance between a position of an object plane and a position of an image plane), L2. However, there have been actually some cases where many different factors could inhibit the relationship in that the filter length is equal to the object plane-image plane distance.

To cope with this failure, such a problem may arise in that if simply the object plane position and the image plane position are established out of a filter, a double symmetry of the trajectory can not be ensured but a second-order geometric aberration would be newly introduced by the filter, resulting in an adversely increased off-axis aberration of the entire optical system including an aberration correction optical apparatus.

To ensure the double symmetry of the trajectory, it is required that two multi-polar type Wien filters should be equally divided into two units and arranged so as for each center thereof to be aligned with a ¼ plane position or a ¾ plane position along the object plane-image plane segment (between the object plane position and the image plane position), as shown in FIG. 1. However, even with such an arrangement employed, the off-axis aberration could still be increased.

An analysis conducted on an electromagnetic field and a charged particle beam trajectory has shown the following facts. Specifically, as for a trajectory created by a beam that has been emitted initially along an axis with a certain angle of aperture (i.e., H trajectory or Axial Ray), the double symmetry of the trajectory can be consequently ensured under a bidirectional focusing and two-time image-formation condition. However, with the same condition applied, a trajectory created by a beam that has been emitted initially with a certain object height (i.e., G trajectory or Field Ray) could not ensure the double symmetry.

Any attempt to ensure the double symmetry for the G trajectory may adversely lead to an application of the multipolar field that is more intensive than the two-time image-formation condition, again failing to ensure the double symmetry for the H trajectory. This phenomenon of different requisite conditions being introduced between the H trajectory and the G trajectory to ensure the double symmetry when the filter length, L1, is not equal to the object plane-image plane distance, L2, as described above, can be explained as follows, with reference to FIG. 2.

Specifically, for the H trajectory, since the beam is flying at an angle, merely some movement of the beam in the drift space free from the multi-polar field could cause the beam to be converged or to be diverged and bent more sharply in order to enter the multi-polar field with a condition far away from an axis, from which it could be said for the H trajectory that only the existence of the drift space could affect the focus of the beam. However, for the G trajectory, since the beam is emitted in parallel with the optical axis, therefore the focus of the beam would not be affected by anything until it enters the multi-polar field. Further, unless the beam modifies its trajectory so as to be parallel to the axis on an intermediate image-formation plane, the symmetry of the trajectory on that plane would not be ensured. Due to this, even if the double symmetry could be ensured for the H trajectory, that for the G trajectory could not be ensured, so that a second-order geometric aberration would be induced, adversely leading to the increased off-axis aberration in the entire optical system incorporated with the aberration correction optical apparatus.

The present invention has been made in light of the above-pointed problems associated with the prior art, and an object thereof is to provide an aberration correction optical apparatus having a plurality of multi-polar Wien filters capable of compensating for an aberration in a charged particle beam optical system.

Another object of the present invention is to provide an aberration correction optical apparatus for a charged particle beam optical system, capable of compensating for a lens effect on the G trajectory by means of an arrangement of an optical element having the two directional focus at such a location that can provide the lens effect (i.e., the optical element capable of inducing a rotationally symmetric lens effect) primarily on the G trajectory along the object plane-image plane segment in the aberration correction optical apparatus.

Yet another object of the present invention is to provide an image projection optical system and/or a scanning type optical system, which are (is) incorporated with the same aberration correction optical apparatus.

The present invention relates to an electron beam apparatus in which a primary electron beam generated by an electron gun is irradiated onto a sample and secondary electrons emanating from the sample are formed into an image on a detector by an image projection optical system. The electron beam apparatus of the present invention is characterized in that the electron gun has a cathode and a drawing electrode, wherein an electron emission surface of the cathode defines a concave surface.

The electron beam apparatus of the present invention may have a configuration as defined below. (1) An electron emission surface of the cathode is composed of a partial inner surface of a first sphere. (2) A drawing electrode has a convex surface composed of a partial outer surface of a second sphere facing to the electron emission surface of the cathode and an aperture formed though the convex surface for passage of electrons. (3) A relationship among a distance, L, along an axial line between the electron emission surface of the cathode and the convex surface of the drawing electrode, a radius of curvature, Rc, of the first sphere and a radius of curvature, Ra, of the second sphere may be represented by that the L is greater than $L_0$, where the $L_0$ is a distance between the electron emission surface of the cathode and the convex surface of the drawing electrode in case where the first sphere and the second sphere define concentric spheres. That is, the relationship among the distance, L, along an axial line between the electron emission surface of the cathode and the convex surface of the drawing electrode, the radius of curvature, Rc, of the first sphere and the radius of curvature, Ra, of the second sphere may satisfy a condition defined by (Rc−Ra)<L.

(4) The electron emission surface of the cathode is composed of a partial inner surface of a first sphere and the drawing electrode has a convex surface composed of a partial outer surface of a second sphere facing to the electron emission surface of the cathode and an aperture formed though the convex surface for passage of electrons. (5) A relationship among a distance, L, along an axial line between the electron emission surface of the cathode and the convex surface of the drawing electrode, a radius of curvature, Rc, of the first sphere and a radius of curvature, Ra, of the second sphere satisfies a condition defined by (Rc−Ra)<L<Rc. (6) The primary electron beam is irradiated onto the sample via a beam deflector. (7) The image projection optical system includes an objective lens, an NA aperture, a shield tube for preventing a magnetic field of the beam deflector from affecting the secondary electrons, a magnifying lens, and an axial alignment deflector. (8) The detector is an EB-CCD detector (camera) or an EB-TDI detector (camera).

The present invention further relates to an electron beam apparatus adapted to irradiate a primary electron beam generated by an electron gun onto a sample. In the electron beam apparatus of the present invention, the electron gun has a cathode and a drawing electrode, the cathode having an electron emission surface composed of a partial inner surface of a first sphere and the drawing electrode having a convex surface composed of a partial outer surface of a second sphere facing to the electron emission surface of the cathode and an aperture formed though the convex surface for passage of electrons, wherein the electron beam apparatus includes a multi-polar astigmatizer lens, or a lens configured to converge a beam in one direction (X direction) and diverge the beam in the other direction (Y direction), between an anode and a sample (target).

An electron apparatus of the present invention may comprise the following configuration. (9) The distance, L, along the axial line between the electron emission surface of the cathode and the convex surface of the drawing electrode is defined with respect to a radius of curvature, Rc, of the first sphere and to a radius of curvature, Ra, of the second sphere, by that the Rc or the Ra is ½ or shorter. In other words, (10) The relationship among the distance, L, along the axial line between the electron emission surface of the cathode and the convex surface of the drawing electrode, the radius of curvature, Rc, of the first sphere and the radius of curvature, Ra, of the second sphere satisfies a condition defined by 2Rc<L+Ra. Alternatively, (11) The relationship among the distance, L, along the axial line between the electron emission surface of the cathode and the convex surface of the drawing electrode, the radius of curvature, Rc, of the first sphere and the radius of curvature, Ra, of the second sphere may satisfy a condition defined by 2Ra<Rc−L. (12) The primary electron beam is irradiated onto the sample via a condenser lens, an FA aperture, a projection lens, an axial alignment lens, a beam deflector and an objective lens. (13) The secondary electrons emanating from the sample are formed into an image on a detector by an image projection optical system. (14) The image projection optical system includes an objective lens, an NA aperture, a shield tube for preventing a magnetic field of the beam deflector from affecting the secondary electrons, a magnifying lens, and an axial alignment deflector. (15) The detector is an EB-CCD detector (camera) or an EB-TDI detector (camera).

According to the present invention, provides is an aberration correction optical apparatus for a charged particle beam optical system, characterized in comprising:

two identically sized multi-polar Wien filters arranged such that their centers are aligned with a ¼ plane position and a ¾ plane position, respectively, along an object plane-image plane segment in the aberration correction optical apparatus; and optical elements having bidirectional focus disposed in an object plane position, an intermediate image-formation plane position and an image plane position in the aberration correction optical apparatus.

Further, according to the present invention, provided is an aberration correction optical apparatus for a charged particle beam optical system characterized in that the Wien filters are sized identically and that the apparatus comprises:

two identically sized multi-polar Wien filters arranged such that their centers are aligned with a ¼ plane position and a ¾ plane position along an object plane-image plane segment in the aberration correction optical apparatus; and a plurality of optical elements having bidirectional focus disposed in both sides of each of the Wien filters with respect to the traveling direction of the charged particle beam in a symmetric configuration relative to the center of each of the Wien filters such that a distance between the centers of the wien filters is shorter than a distance between an object plane position or an image plane position and an intermediate image-formation position.

In the above-defined aberration correction optical apparatus, the optical element may be anyone of a rotationally symmetric lens, a multi-polar lens, the Wien filter, and an electromagnetic prism.

According to the present invention, provided is an image projection optical system for guiding a charged particle beam emanating from a sample surface to a final image-formation plane, the image projection optical system characterized in that an aberration correction optical apparatus as defined above is arranged in a first image-formation plane between an objective lens and an intermediate lens in the image projection optical system such that the first image-formation plane is in alignment with an image plane position in the aberration correction optical apparatus. The present invention further provides a scanning type optical system for guiding a charged particle beam emanating from a charged particle beam source to a sample surface, the scanning type optical system characterized in that an aberration correction optical apparatus as defined above is disposed in an intermediate image-formation plane of a front stage of an objective lens in the scanning type optical system.

According to the present invention, it becomes possible to improve a resolution by a charged particle beam optical system as a whole. In addition, since an aperture angle can be made larger, while maintaining a substantially same level of resolution as that achieved by the conventional technologies, therefore a beam transmission rate can be higher, which in turn contributes to the increased throughput by increasing a volume of signal without increasing an illumination current, over a defect inspection apparatus using an image projection optical system applied with the charged particle beam according to the conventional technologies.

BRIEF DESCRIPTION OF THE DRAWINGS

FIG. 15(A) shows a schematic view of a typical scanning type optical system according to the conventional technology, and FIG. 15(B) shows a schematic view of a scanning type optical system according to the present invention incorporated with an aberration correction optical apparatus shown in FIG. 13.

DESCRIPTION OF REFERENCE NUMERALS

Figure 1:
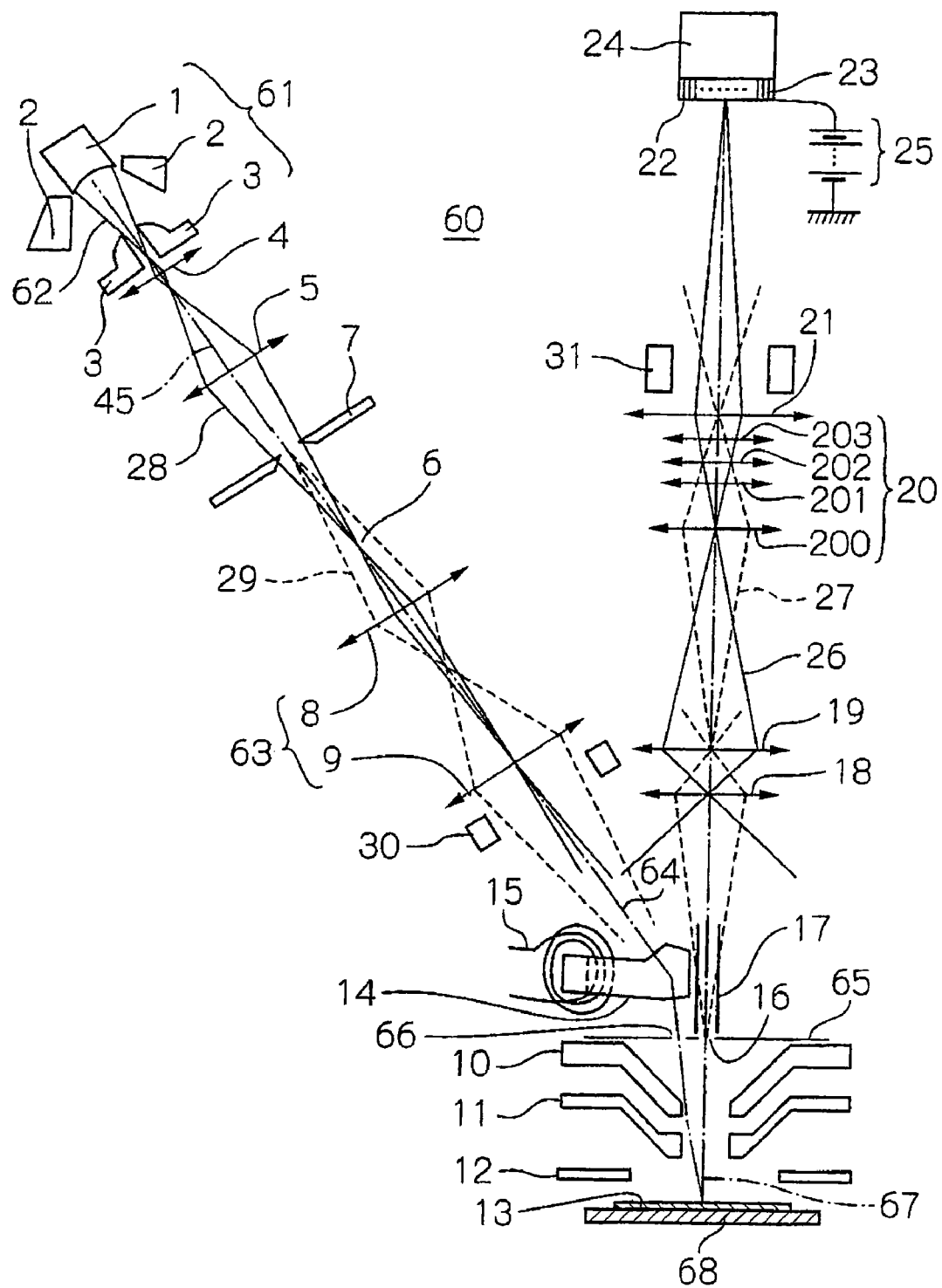
FIG. 1 is a schematic layout of an electron beam apparatus according to an embodiment of the present invention.

Elements in the drawings are designated by reference numerals as follows:

1: Electron gun cathode, 2: Wehnelt electrode, 3: Drawing electrode, 4: Condenser lens 1, 5: Condenser lens 2, 6: Crossover image, 7: FA aperture, 8: Projection lens, 9: Projection lens 2, 10: Third electrode of an objective lens, 11: Intermediate electrode of an objective lens, 12: Lower electrode of an objective lens, 13: Sample, 14: Beam deflector; 15: Exciting coil for a beam deflector, 16: NA aperture, 17: Shield tube, 18: Auxiliary lens, 19:

Magnifying lens, 21: Final magnifying lens, 22: Scintillator, 23: FOP, 24: EB-TDI camera, 25: Power supply, 26: Sample image-formation line, 27: NA aperture image-formation line, 28: Electron gun crossover image-formation line, 29: FA aperture image-formation line, 30: Axial alignment deflector, 31: Axial alignment deflector, 41: Carbon heater, 42: Supporting electrode, 43: Anode, 44: Electrostatic quadrupole, 46: Optical axis, 46: Electrostatic quadrupole, 47: Exciting coil, 48: Beam section, 51: 10 KeV equipotential line, 52: 20 KeV equipotential line, 53: 20 KeV equipotential line, 54: 27 KeV equipotential line, 55: Crossover diameter (about 113 μmφ), 61: Electron gun, 62: Electron beam, 63: Projection lens, 64: Primary beam, 66: Aperture, 67: Optical axis of a secondary optical system, 68: Stage, 69, 71: Conical surface, 72: Vertical plane, 73: Aperture, 200: Auxiliary lens for largest pixel mode, 201: Auxiliary lens for second largest pixel mode, 202: Auxiliary lens for third largest pixel mode, 204: Auxiliary lens for smallest pixel mode, 461, 462, 463, 464: Magnetic pole, 101, 101a, 101b: Charged particle beam optical system, 102, 102': Multi-polar Wien filter, 103a, 103b: Unipotential lens, 104a, 104b: Correction optical apparatus, 110 an image projection optical system, and 120a: Scanning type optical system.

BEST MODE FOR CARRYING OUT THE INVENTION

FIG. 1 is a schematic layout of an electron beam apparatus according to an embodiment of the present invention. With reference to FIG. 1, an electron beam apparatus 60 comprises an electron beam source 61, a projection lens 63, a beam deflector 14, a stage 68 on which a sample 13, such as a wafer, is placed, an NA aperture plate 65, a shield tube 17 and an EB-TDI camera 24. The electron gun 61 includes a cathode 1, a Wehnelt electrode 2 and a drawing electrode 3. The projection lens 63 includes a first projection lens 8 and a second projection lens 9.

In the electron beam apparatus 60 of FIG. 1, an electron beam 62 from the electron gun 61 is irradiated onto an FA aperture (Field Aperture: an aperture for determining a field of view), and an image of the FA aperture 7 has its contracting scale modified by the two-stage projection lens 63 composed of the projection lenses 8, 9 and passes through objective lenses 10, 11 and 12 to be irradiated onto the sample 13. While the beam is traveling, the beam deflector 14 deflects a primary beam 64 by a parallel flat-plate magnetic pole and bends the beam 64 slightly through the objective lenses 10, 11 and 12 for the irradiation onto an optical axis 67. In addition, an image of a light source is formed on a principal plane of the projection lens 9 upstream to the objective lens 10, as shown with an image forming state depicted by a solid line 28. The principal plane of the projection lens 9 may designate a principal plane of a lens having the most expanded image forming line 29. The projection lens 9 may be a lens capable of generating a maximum aberration, so that the image of the light source should be formed on the principal plane of this lens.

Secondary electrons emanating from a sample surface 13 are converged by the objective lenses 12, 11 and 10, and only beams in a central region having a relatively low aberration are permitted to pass through an NA aperture 16 of an NA aperture plate 65 and to proceed upward. An aperture 66 allowing for the passage of the primary beam is separately arranged. The secondary electrons having passed through the NA aperture 16 further pass through the shield tube 17 to be formed into an image on a principal plane of an auxiliary lens 18. The shield tube 17 designates a pipe made of Permalloy and serving to prevent the magnetic field from the beam deflector 14 from leaking into an optical axis 67 of a secondary optical system. The secondary electrons, that have formed a first enlarged image at a location of the auxiliary lens 18, is then magnified by a magnifying lens 19 to be formed into an enlarged image on either one of four lenses 200, 201, 202 or 203 in an auxiliary lens 20 unit for a final magnifying lens 21 unit.

The auxiliary lens 20 unit includes an auxiliary lens for a largest pixel mode 200, an auxiliary lens for a second largest pixel mode 201, an auxiliary lens for a third largest pixel mode 202, and an auxiliary lens for a smallest pixel mode 204. The NA aperture image is formed into a contracted image on a principal plane of the magnifying lens 19 as shown with a formed image depicted by the dotted line 27, and further through any one of the auxiliary lenses, or 200 in the illustrated case, into a contracted image on a principal plane of the final magnifying lens 21. The present invention is directed to achieving the reduced aberration by reducing a flux of light of the beam during its passing through those magnifying lenses 19 and 20.

An electron beam apparatus 60 of FIG. 1 comprises four auxiliary lenses 200, 201, 202 and 203 serving for the final magnifying lens 21 unit. Those four auxiliary lenses allow even four or more varying pixel sizes to be detected by an EB-CCD detector or an EB-TDI detector having a certain detector pitch. The detector may be constructed with a scintillator (fluorescent material) 22 applied over a front surface of an FOP (Fiber Optic Plate) 23, so that an optical signal from an image once stored in the FOP can be detected by a TDI detector 24 for the light. In this case, since the signal to the TDI detector is low, the surface of the scintillator 22 may be applied with a positive voltage as high as 5 KV so as to accelerate and thus increase a luminous efficiency of the secondary electrons for entering the scintillator 22.

Since a distance between the projection lens 9 to the sample 13 critical to the aberration is significant, therefore a spherical aberration during the image-formation between the FA aperture 7 to the sample 13 could be significant. Particularly, when a landing energy to the sample is as high as 500 eV, an inevitable blur of the beam is caused by a space charge effect, calling for an electron gun having a lower brightness and high emittance. To reduce the brightness of the electron gun, it is effective to increase a radius of curvature of the convex cathode to form a flat cathode. To explain this from the fact that when the electron emission surface of the cathode has a convex profile, the density of the electric field in the cathode surface and thus the brightness is high, the brightness can be reduced by increasing the radius of curvature with respect to the profile of the electron emission surface to define a substantially or completely flat surface. The electron gun using the cathode 1 with the electron emission surface 1 defining a concave profile enables to provide much lower brightness and higher emittance.

Figure 2:
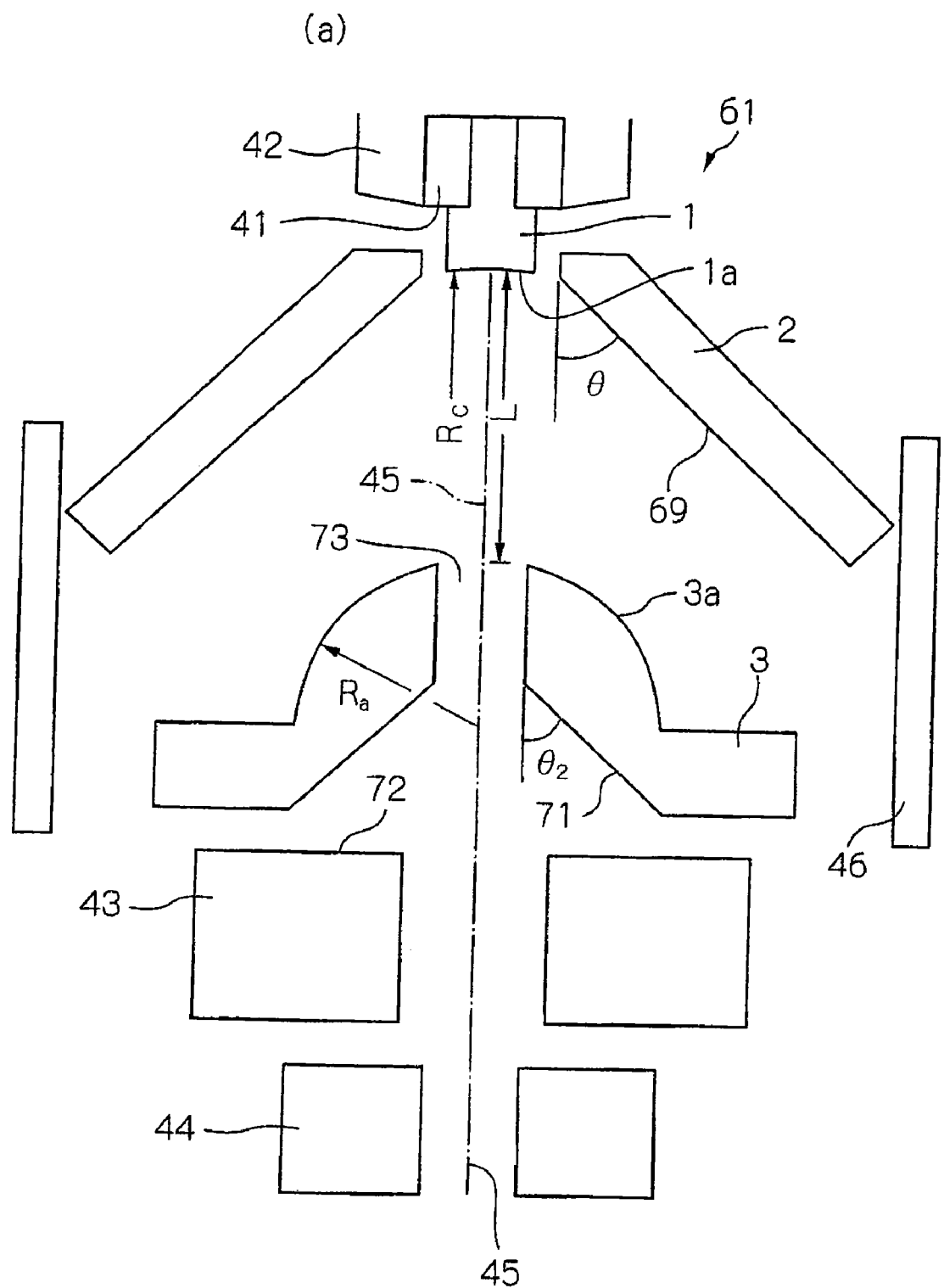
FIG. 2 is an enlarged view of a layout of an electron gun according to an embodiment of the present invention.

FIG. 2 shows a detailed structure of the electron gun 61. An electron emission surface 1a of the cathode 1 has a circular configuration defined by 0.2 mm to 4 mmφ as viewed from the direction of an optical axis 45, and a portion held by a heater 41 has been processed to be flat. The cathode 1 and the heater 41 are further supported by an electrode 42, which is applied with a current to thereby heat the cathode 1. A radius of curvature, Rc, of the concave shaped electron emission surface 1a of the cathode is between 2 mm to 8 mm. The Wehnelt 2 has a conical surface 69 surrounding the optical axis 45, and the performance of the electron gun is controlled by optimizing an angle, θ, formed between the conical surface 69 and the optical axis 45. A simulation has shown that a typical value of the angle is between 40 degrees to 50 degrees. The drawing electrode 3 is composed of a semispherical surface defined by a radius of curvature, Ra, with an aperture 73 for the passage of the beam formed therethrough adjacently to the optical axis 45. A part of the drawing electrode 3 defined in the downstream side has a conical surface 71 defined by an angle, $θ_2$, made with the optical axis 45. An anode 43 disposed adjacent to the drawing electrode 3 is composed of a flat electrode having a flat surface 72 extending vertically with respect to the optical axis 45.

Figure 6:
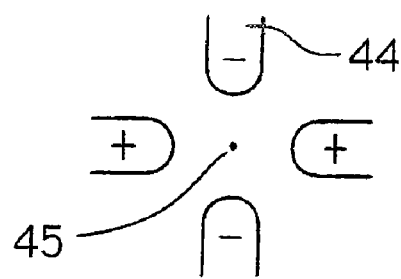
FIG. 6 is a plan view of an electrostatic quadrupole.

To create an elliptical beam defined by an elliptical cross section of the beam (the cross section vertical to the optical axis 45), an electrostatic quadrupole 44 should be disposed downstream to the anode 43 so as to reduce the beam size in one axial direction and increase the beam size in the other axial direction. FIG. 6 is a cross sectional view showing a physical arrangement of positive and negative electric poles of the electrostatic quadrupole 44 in the cross section vertical to the optical axis 45. If the space charge effect is too intensive, the electrostatic quadrupole 44 is required to be placed more closely to the cathode 1. A magnetic quadrupole 46 may be disposed in the back side or outer side of the drawing electrode 3.

Figure 3:
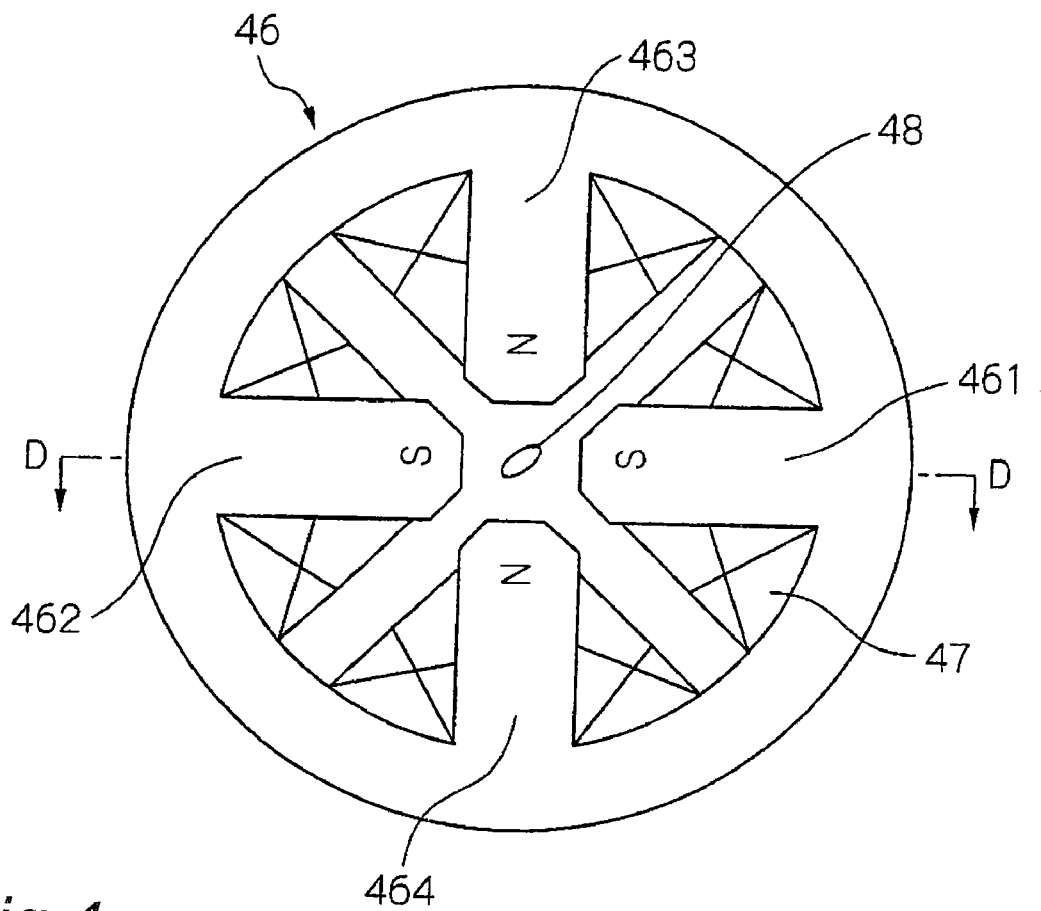
FIG. 3 is a plan view of an electromagnetic quadrupole.
Figure 4:
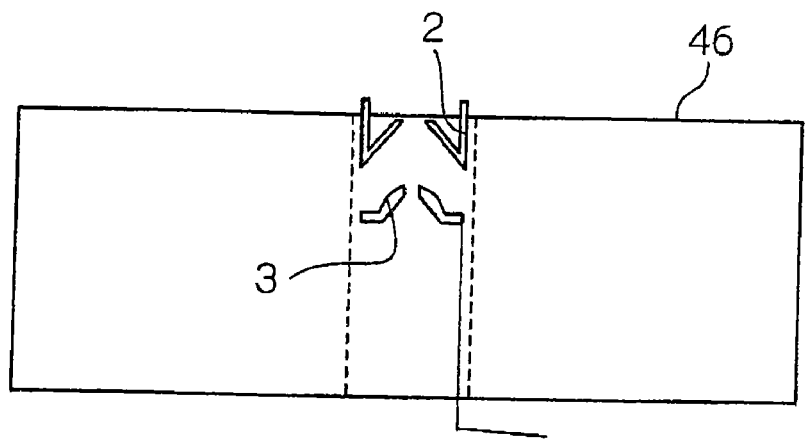
FIG. 4 is a sectional view of an electromagnetic quadrupole.

A detailed description of the magnetic quadrupole 46 is shown in FIGS. 3 and 4. FIG. 3 is a cross sectional view of the magnetic quadrupole 46 vertical to the optical axis, and FIG. 4 is a cross sectional view taken along the D-D line of FIG. 3. As shown in FIG. 3, each of the four radially arranged magnets 461, 462, 463 and 464 is supported and fixed in its radially outer side, each of the magnetic poles being wound by an exciting coil 47, which provides excitation such that each pair of magnetic poles opposite to each other in the radial direction can gain the same polarity. The cross section 48 of the beam (the cross section vertical to the optical axis) is deformed toward the direction defined by an angle of 45 degrees with respect to an axial line of each magnetic pole (radial direction in FIG. 3).

In the conventional Pierce-type electron gun, a curved surface (with the radius of curvature Rc) defining the electron emission surface of the cathode and a curved surface (with the radius of curvature Ra) of the anode opposite the electron emission surface may form concentric spheres. Specifically, they satisfy the relationship of L=Rc−Ra. The L represents a distance between the electron emission surface of the cathode and the curved surface of the anode. In contrast, a first embodiment (FIG. 2) of the present invention is configured such that the radius of curvature, Rc, of the curved surface (the first sphere) 1a defining the electron emission surface of the cathode, the radius of curvature, Ra, of the convex surface (the second sphere) 3a of the drawing electrode 3 and the distance L along the optical axis between the electron emission surface of the cathode and the convex surface 3a of the drawing electrode can satisfy the following relationship:

$$(Rc-Ra)<L<Rc \quad (1)$$

A second embodiment of the present invention is configured such that the relationship among the distance L along the optical axis between the curved surface (the first sphere) 1a defining the electron emission surface of the cathode and the convex surface (the second sphere) 3a of the drawing electrode, the radius of curvature, Rc, of the curved surface (the first sphere) 1a and the radius of curvature, Ra, of the convex surface (the second sphere) 3a satisfies an inequity defined by:

$$2Rc<L+Ra \quad (2)$$

A third embodiment of the present invention is configured such that the relationship among the distance L along the optical axis between the curved surface (the first sphere) 1a defining the electron emission surface of the cathode and the convex surface (the second sphere) 3a of the drawing electrode, the radius of curvature, Rc, of the curved surface (the first sphere) 1a and the radius of curvature, Ra, of the convex surface (the second sphere) 3a satisfies an inequity defined by:

$$2Ra<Rc-L \quad (3)$$

Figure 7:
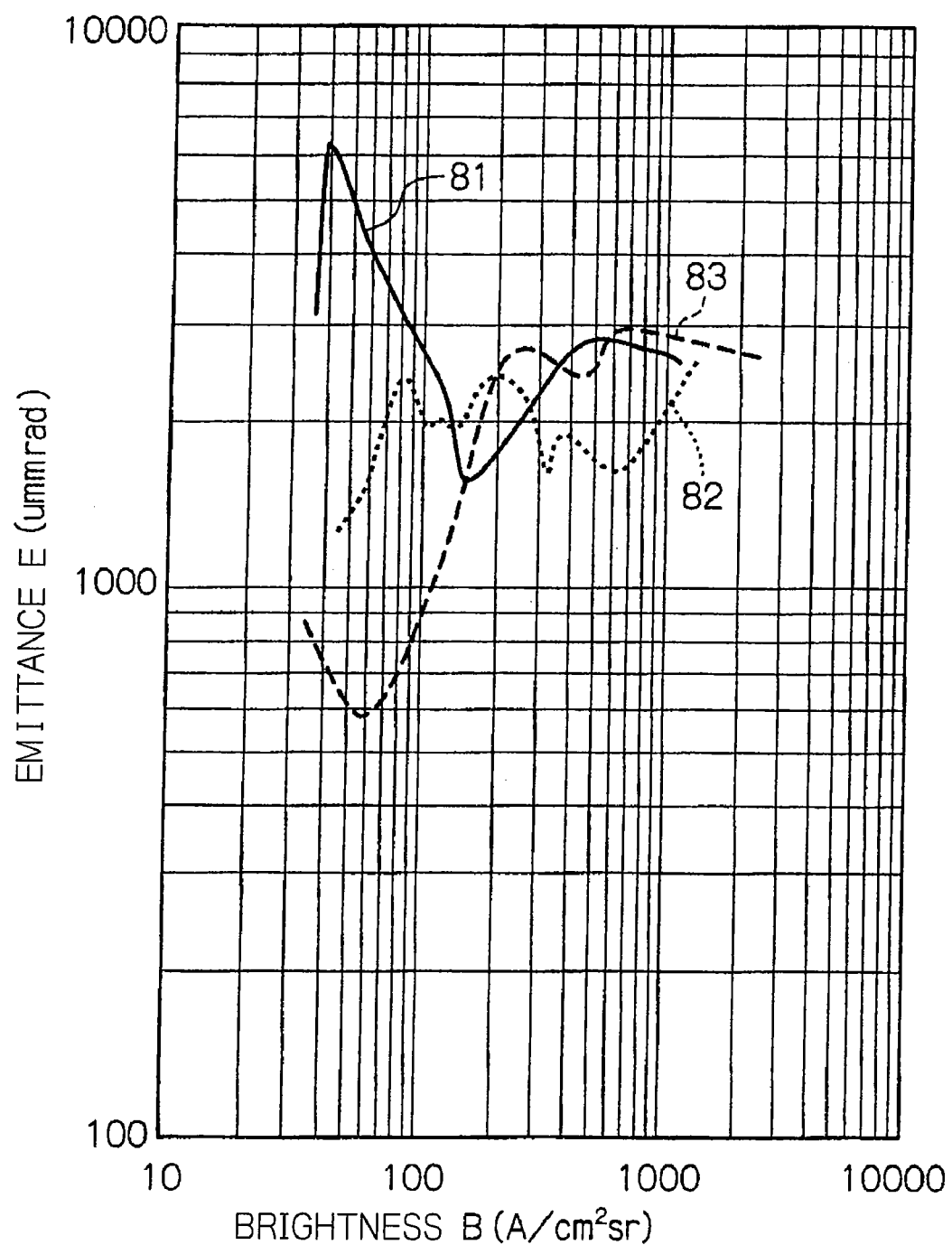
FIG. 7 is a graphical representation of a comparison of property between Pierce type electron gun and an electron gun of the present invention.
Figure 8:
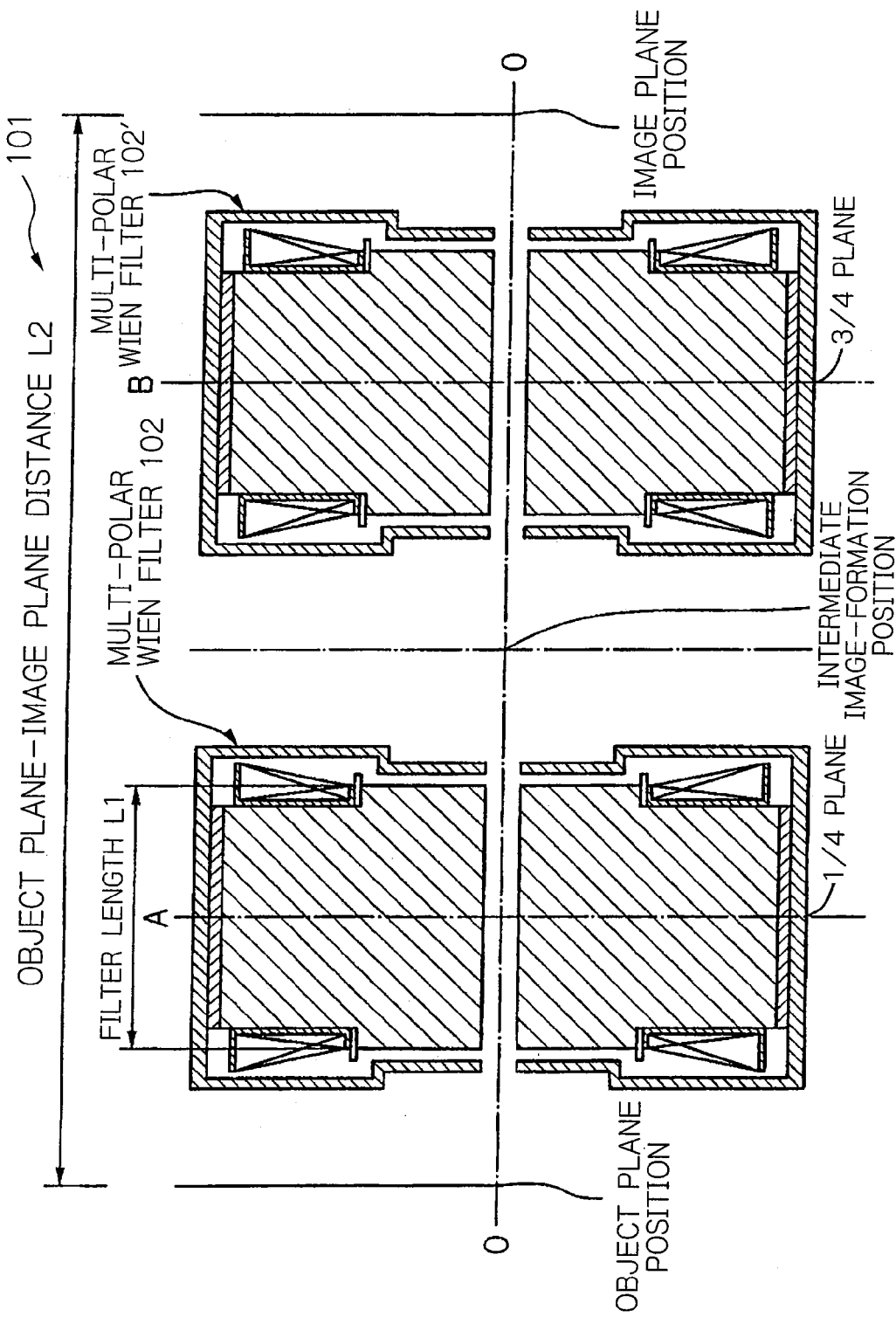
FIG. 8 shows a correction optical apparatus simply having two multi-polar Wien filters.
Figure 9:
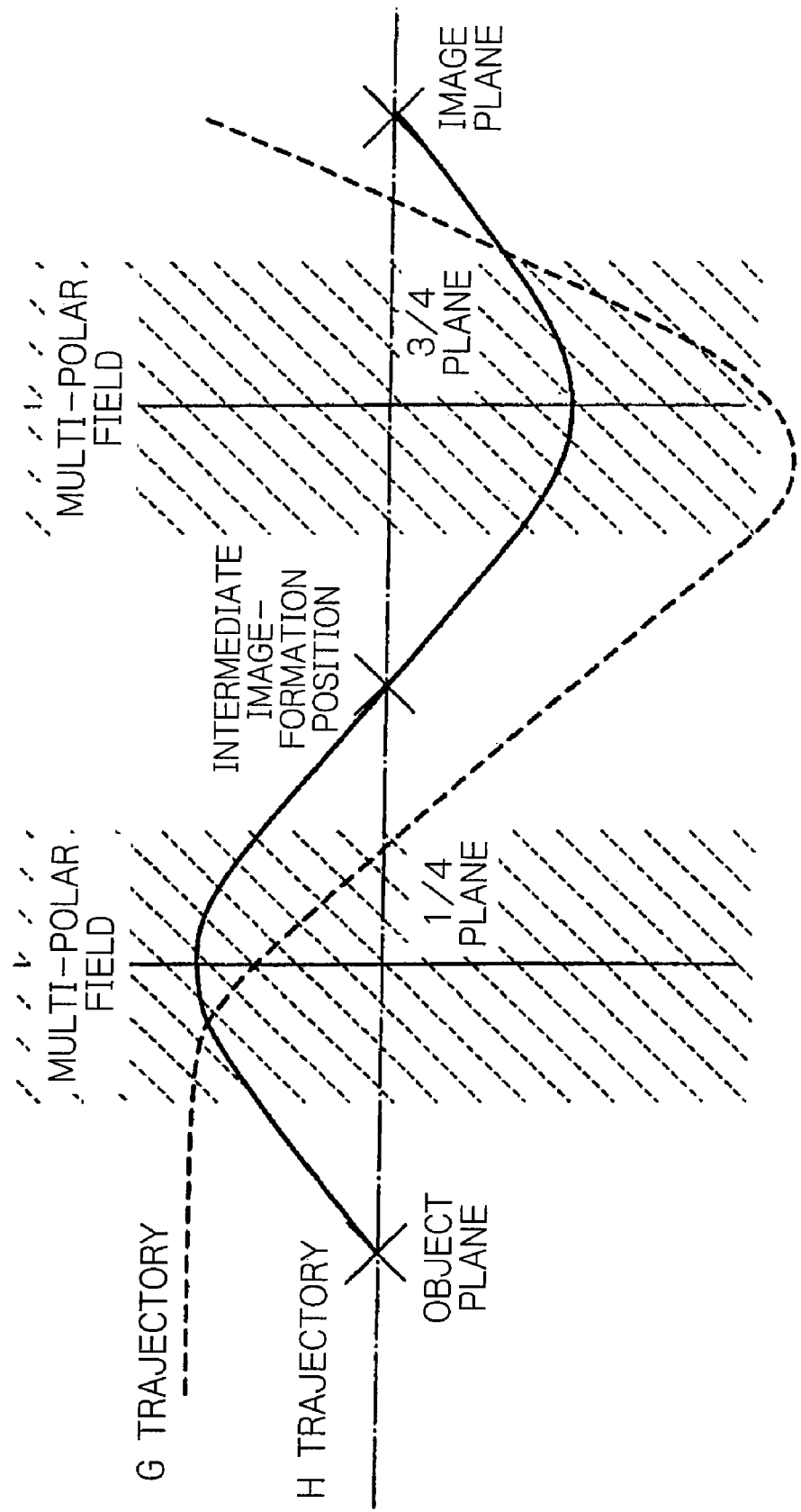
FIG. 9 shows a reference trajectory in a correction optical apparatus of FIG. 8.

For the Pierce type electron gun, which satisfies an equation defined by L=Rc−Ra, the curvature surface (the first sphere) 1a and the curvature surface (the second sphere) 3a represent concentric spheres. As obviously seen from the comparison to that, the cathode-anode distance L defined by the above inequity (1) is longer than a difference between the radii of concentric spheres. FIG. 7 shows a graphical representation of a beam property from a simulation taking the Rc=5 mm, Ra=2 mm and L=4 mm in order to satisfy the above inequity (1). The cathode diameter used was 0.28 mm.

The graphical representation of FIG. 7 depicts a comparison of property between the Pierce type electron gun and the electron gun of the present invention. A curve 81 indicates the property of the electron gun of the present invention, or the case employing L=4 mm, Rc=5 mm and Ra=2 mm, while a dotted line 82 indicates the property of the Pierce type electron gun, or the case employing L=3 mm, Rc=5 mm and Ra=2 mm. A broken line 83 indicates the property of the case employing L=5 mm, Rc=5 mm and Ra=2 mm. In the curve 81 of FIG. 7 or (Rc−Ra)<L<Rc of the present invention, the emittance is overwhelmingly great for the brightness of 140 A/cm²sr or lower. In the broken line 83 of FIG. 7 representing L=Rc, although a high level of emittance can be obtained for the brightness which is not lower than 200 A/cm²sr, this is not suitable for the electronic optical system of imaging type which requires a higher emittance in the lower brightness. It is apparent from the above that the relationship, L<Rc, achieved by the present invention is required.

FIG. 7 shows that, when the brightness is low (for example, when the brightness is 100 A/cm²sr), the electron gun of the present invention (the curve 81) can obtain a higher emittance over the Pierce type electron gun (the curve 82). Especially, the electron gun of the present invention (the curve 81) can obtain a higher emittance when the brightness is between 40 A/cm²sr and 70 A/cm²sr. In order to obtain an image of around 2048×512 pixels with a pixel size around 100 nm, the simulation has shown that, preferably the brightness around 50 A/cm²sr should be used, and for this case, the electron gun of the present invention would exhibit an extremely high performance.

Figure 5:
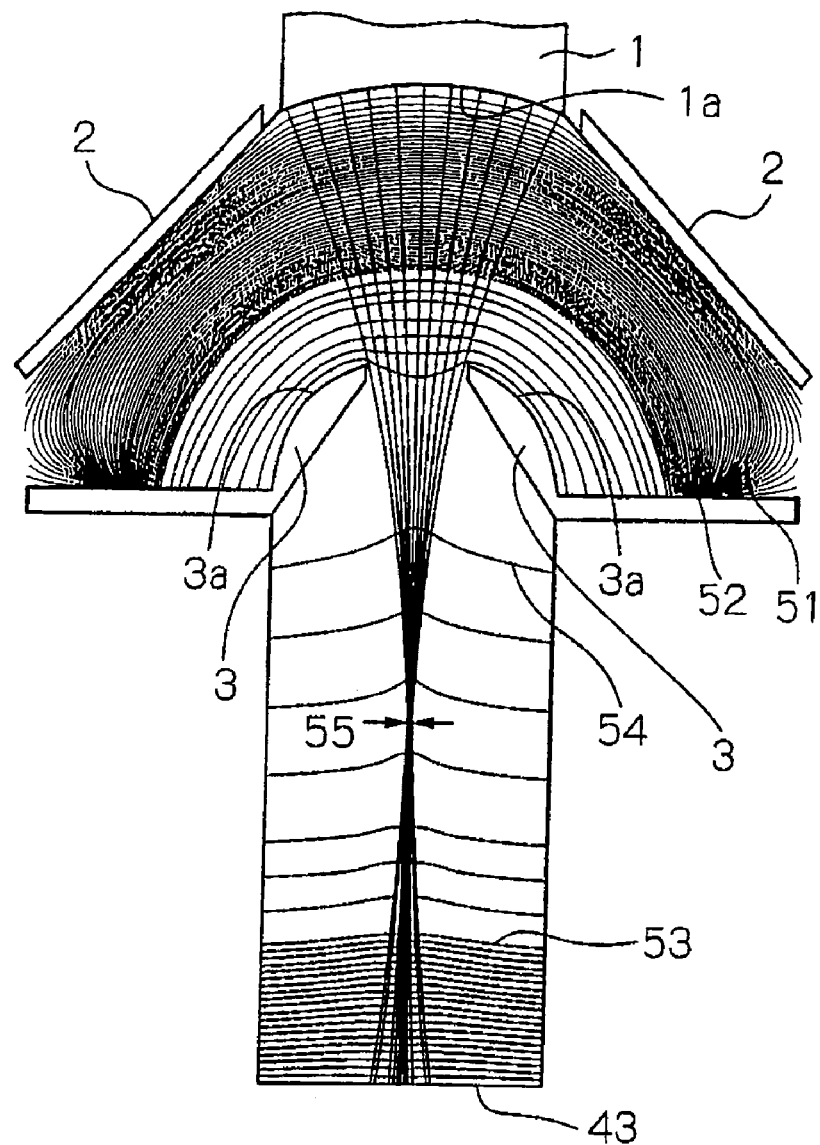
FIG. 5 is a schematic diagram of a simulation example of an electron gun of the present invention.

FIG. 5 shows another embodiment having the distance between the cathode electron emission surface (the curved surface 1a) and the curved surface 3a of the drawing electrode 3 that is longer as compared to that in the Pierce type electron gun. In the embodiment of FIG. 5, the drawing electrode 3 also serves as the anode (the anode 43 of FIG. 2) having the cathode diameter=4 mm, the Rc=5 mm, the anode radius of curvature Ra=2 mm, and the L=5 mm. In the simulation example of FIG. 5, a curve 51 represents an equipotential line of 10 kV. Curves 52 and 53 are both equipotential lines of 20 kV, and a curve 54 is an equipotential line of 27 kV. A crossover diameter 55 was about 113 μmφ. In the above simulation of FIG. 5, the current density near to 10 KA/cm², or the current density=$0.995[π(113×10^{-4}/2)^2]$=9.921 KA/cm², was obtained.

In the simulation example of FIG. 7, when the dimension L between the cathode electron emission surface (the curved surface 1a) and the curved surface 3a of the drawing electrode 3 was modified from 3 mm for the Pierce type electron gun to the L=5 mm, the brightness of 900 A/cm$^2$sr and the emittance of 2000 μm·mrad were obtained at the acceleration voltage of 4.5 KV. In addition, the brightness of $1.2 \times 10^4$ A/cm$^2$sr and the emittance of 1000 μm·mrad were obtained at the acceleration voltage of 7 KV. The electron gun having such performance is preferable for the electron beam apparatus of the image projection optical system.

Figure 10:
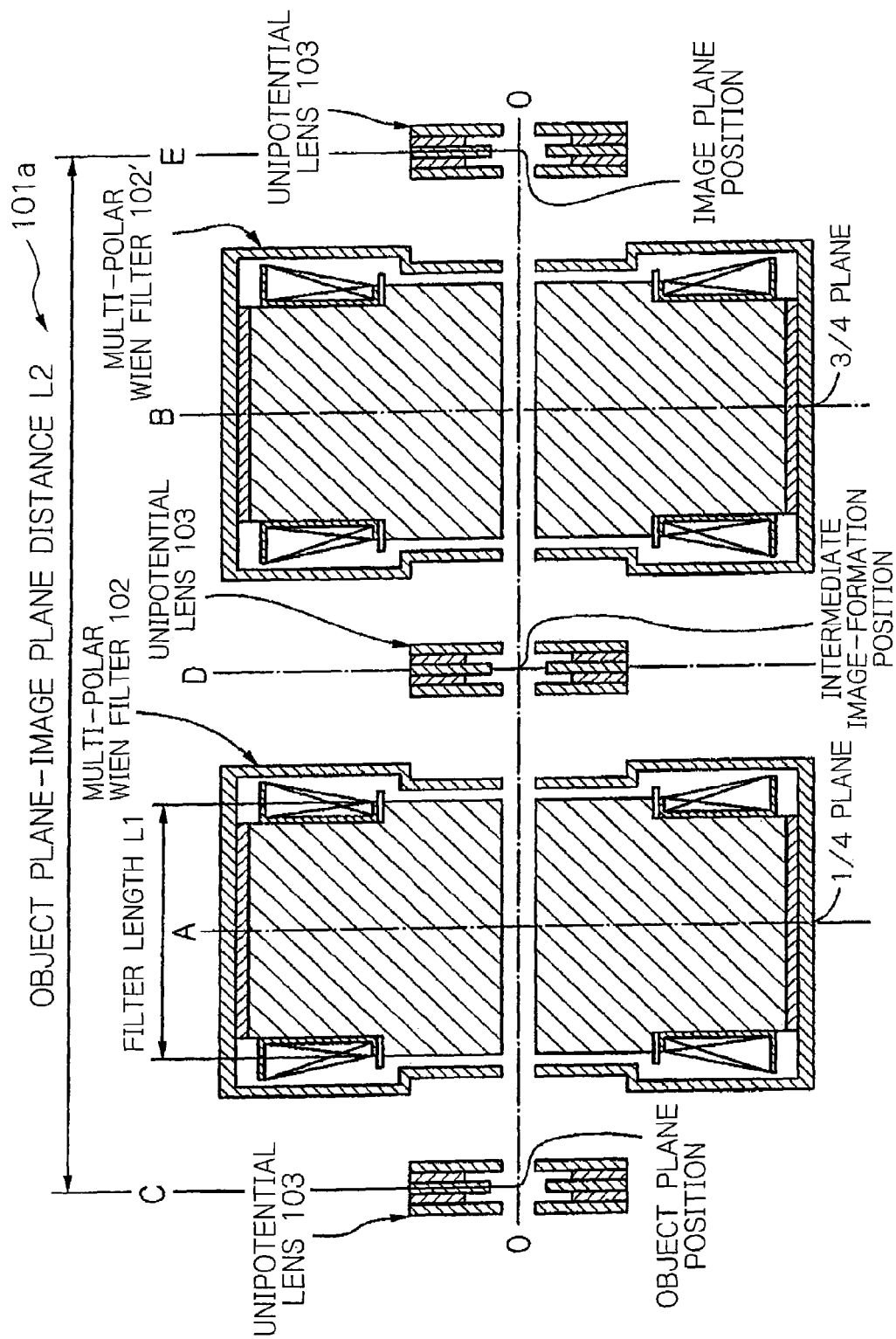
FIG. 10 shows a first embodiment of an aberration correction optical apparatus according to the present invention.

With reference to FIG. 10, one embodiment of an aberration correction optical apparatus for a charged particle beam optical system according to the present invention is generally designated by numeral reference 101a. In FIG. 10, reference numerals 102 and 102' designate a plurality (two in the illustrated embodiment) of multi-polar Wien filters having the same size and brightness. The term "having the same size and brightness" used herein means that the two multi-polar Wien filters have the same dimension or size and thus have the same condition for the voltage or current to be applied to them. Those two multi-polar Wien filters 102 and 102' are disposed such that their centers are substantially aligned with the optical axis O-O of the aberration correction optical apparatus 101a, and placed in a ¼ plane position along the object plane-image plane segment in the aberration correction optical apparatus 1a (the term "¼ plane position" for the purpose of the present invention refers to a position of a first quarter of the distance L2 corresponding to the object plane-image plane segment measured from the object plane position, C, in the applied aberration correction optical apparatus), which is referred to as A, and in a ¾ plane position (the term "¾ plane position" for the purpose of the present invention refers to a position of third quarter of the distance L2 corresponding to the object plane-image plane segment measured from the object plane position, C, in the applied aberration correction optical apparatus), which is referred to as B. Since the structure and function of the multi-polar Wien filter used in the present embodiment are same as those commonly used, a detailed description on the structure and function is herein omitted.

Unipotential lenses 103a are disposed in the object plane position C, a ½ plane (intermediate image plane) position (the term "½ plane position" for the purpose of the present invention refers to a position of a first half of the distance L2 corresponding to the object plane-image plane segment measured from the object plane position in the applied aberration correction optical apparatus), which is referred to as D, and the image plane position, E, respectively. Each of those unipotential lenses 103a constructs an optical element having bidirectional focus and oriented with their centers substantially aligned with the optical axis O-O in the above-designated positions C to E, respectively. In this regard, the two among those three unipotential lenses, which are specifically placed in the object plane position C and the image plane position E may have the same size (dimension) and the same lens brightness, whereas the one placed in the intermediate image plane position D may have the same size with the other two potential lenses but different (higher) lens brightness from them. It is to be noted that the above-mentioned term "centers" of the multi-polar Wien filters 102 and 102' and the unipotential lenses 103a refers to the optical centers. Each of the unipotential lenses 103a may be constructed in the multi-polar structure by overlapping dipolar or quadrupolar fields to serve for providing axial adjustment and for compensating for a gap resultant from a magnification scale. Although, instead of the unipotential lens 103a, a rotationally symmetric electromagnetic lens or an electromagnetic lens of multi-polar structure may be employed, the electrostatic type may be more preferably employed from the consideration of the rotational effect on the image.

The aberration correction optical apparatus 101a is composed of the two multi-polar Wien filters and the three unipotential lenses 103a and serves to compensate for the aberration in the charged particle beam optical system (not illustrated) into which the same aberration correction optical apparatus is incorporated. It is to be noted that the aberration correction of a high energy beam can be made possible by employing a bipotential lens for the lenses placed in the object plane position C and the image plane position E to reduce a reference energy of electrons inside the aberration correction optical apparatus without undesirably increasing the size of the aberration correction optical apparatus.

In addition, none of the unipotential lenses are necessarily rotationally symmetric lenses but may be any optical element having the bidirectional focus, including the Wien filters and the electromagnetic prisms.

Figure 11:
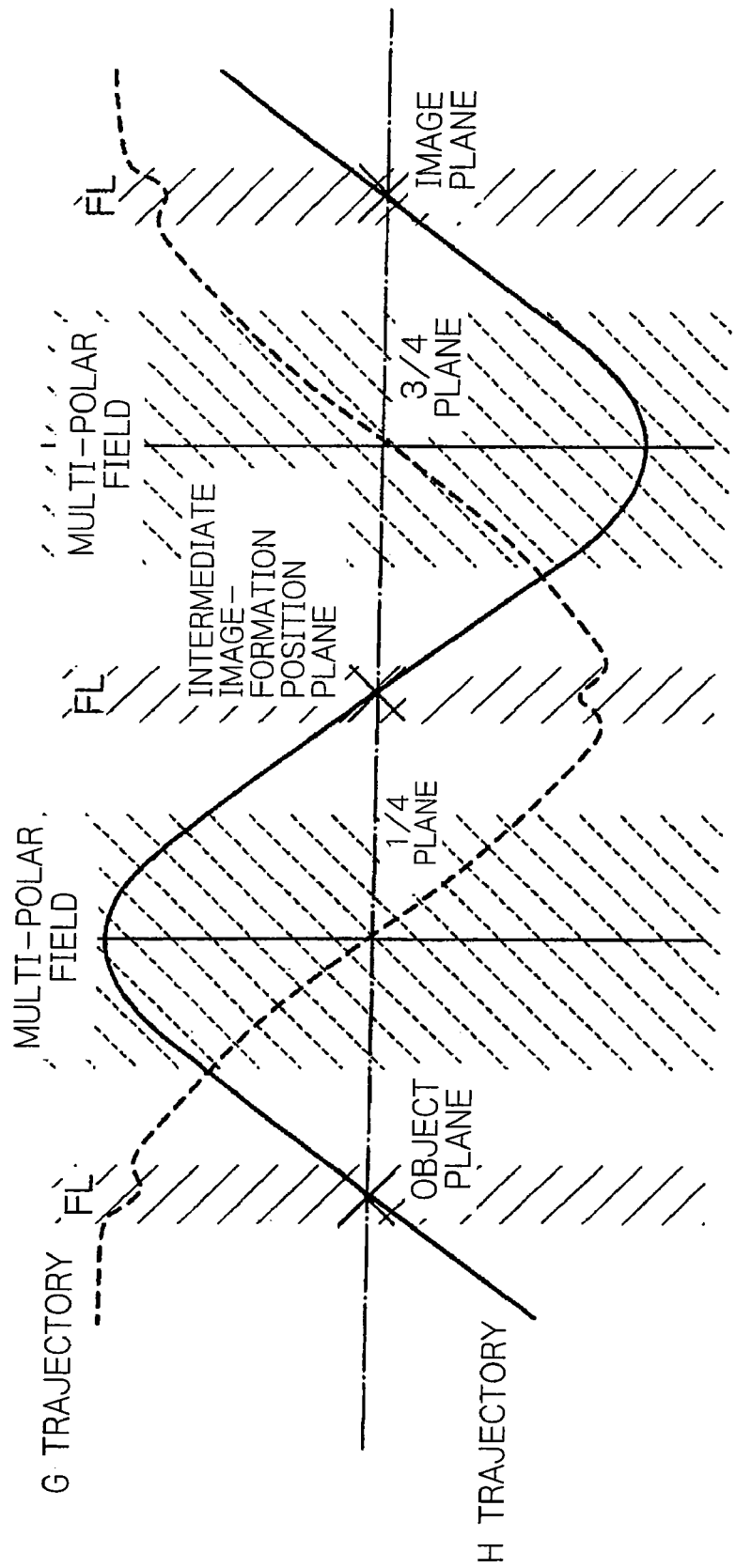
FIG. 11 shows a reference trajectory in an aberration correction optical apparatus of FIG. 10.
Figure 12:
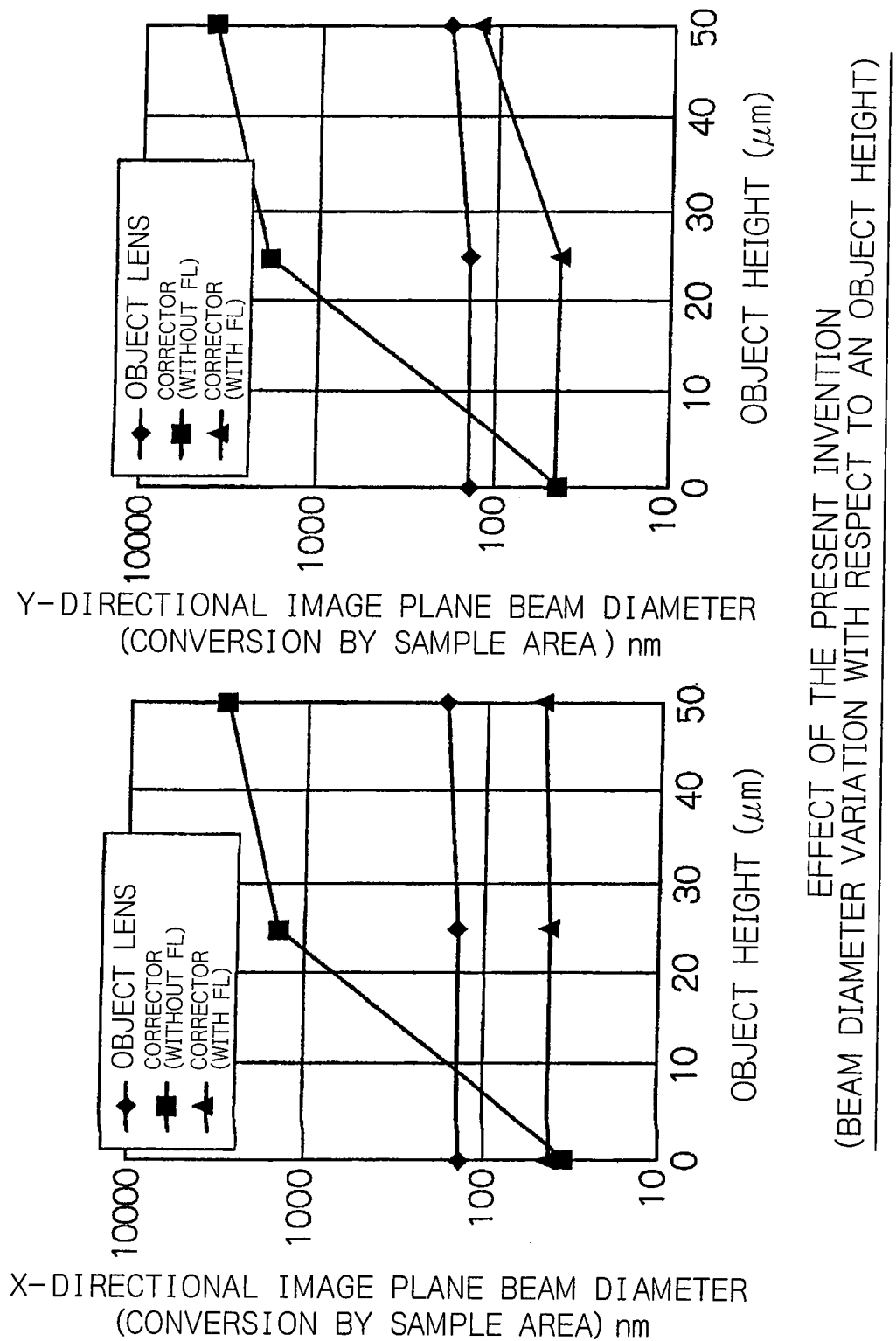
FIG. 12 shows an effect by an aberration correction optical apparatus shown in FIG. 10.

FIG. 11 shows a reference trajectory in the above-described arrangement. As illustrated, not only the H trajectory but also the G trajectory is ensured its double symmetry. FIG. 12 shows a graphic representation of image blurring with respect to an object height in the above-described arrangement and in an optical system simply including two multi-polar Wien filters. In this regard, the term "object height" refers to a distance from image point of interest on the object plane to a junction made by a normal line extending from the point of interest onto the optical axis O-O. It is to be noted that the object plane of each aberration correction optical apparatus was previously given an aberration from the objective lens of the image projection optical system and is currently in the condition where the aberration has been compensated for on the axis properly with the aid of the aberration correction optical apparatus. As obviously seen from the illustration, the optical system simply including the two multi-polar Wien filters successfully compensates for the axial image blurring but adversely degrades the off-axial image blurring to be worse than before.

On the other hand, in the aberration correction optical apparatus of the present invention, the image blurring was successfully corrected within a range of the field of view. The aberration from the objective lens of the image projection optical system used in this example is prominent in an axial chromatic aberration and if used in conjunction with the correction optical apparatus of the present invention, can improve the resolution by the entire optical system. Further, since the aperture angle can be made larger, advantageously, while maintaining the resolution substantially equivalent to that achieved by the conventional technique, the beam transmission rate can be higher, thus contributing to improving throughput by increasing a volume of signal without increasing an illumination current as compared to the case of a defective inspection apparatus employing conventional image projection optical system.

Although the description has been made only on the basis of the example of the present invention applied to the aberration correction in the image projection optical system, it should be appreciated from the fact that if the charged particles are electrons and the energy of the electrons is not greater than 30 keV, there should be a practical condition on a size and an electromagnetic condition, that the correction optical apparatus of the present invention is applicable to all of the applications that can be operated within an energy range as described above. Specifically, the application may include a scanning type microscope and a low accelerated electron beam exposure. In addition, even if the charged particles are ions, the aberration correction should be feasible from the principle. However, for the ions, since a specific charge is significantly smaller as compared to the electrons and thus the flying speed should be proportionally reduced, it is required to increase significantly the magnetic field for the purpose of generating an equivalent effect. This restricts the applicable accelerating energy for the ions by the correction optical apparatus of the present invention to 2 kV or lower.

Figure 13:
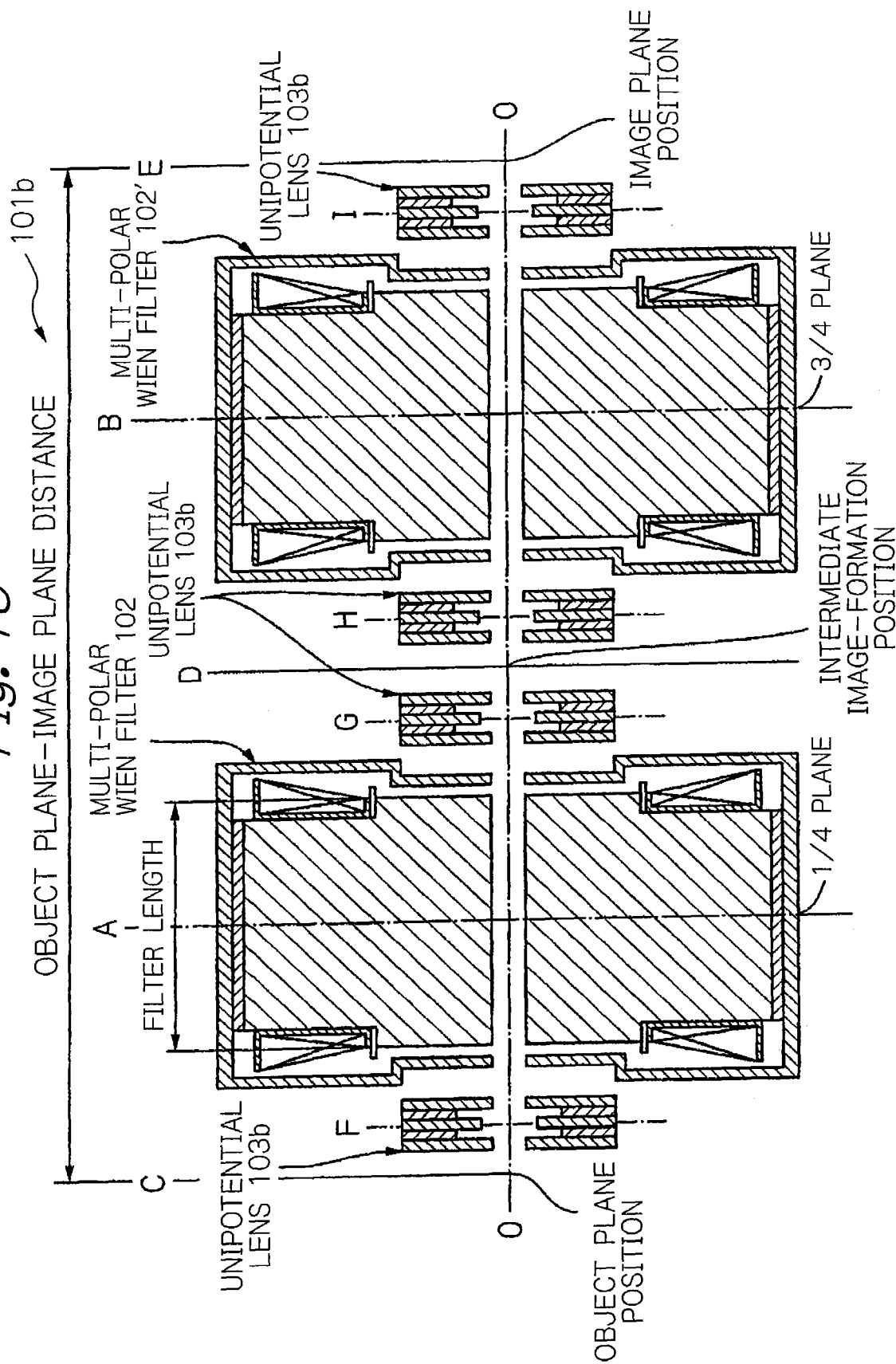
FIG. 13 shows a second embodiment of an aberration correction optical apparatus of the present invention.

With reference to FIG. 13, another embodiment of an aberration correction optical apparatus of the present invention is generally designated by reference numeral 101b. The same size and the same physical arrangement of the two multi-polar Wien filters as used in the previous embodiment are employed in the illustrated embodiment, but a difference is that the illustrated embodiment comprises four unipotential lenses 103b serving for an optical element having the bidirectional focus. Unipotential lenses 103b are disposed in both sides of each of the Wien filter 2 with respect to the traveling direction of the charged particle beam (in the upstream side and the downstream side with respect to the each Wien filter viewed along the traveling direction of the charged particle beam) in a symmetric configuration relative to the center of each Wien filter such that a distance between the centers is shorter than a distance between the object plane position or the image plane position and the intermediate image-formation position in the correction optical apparatus 1b. To explain in more detail, the unipotential lenses 103b are disposed with respective centers substantially aligned with the optical axis O-O, such that respective centers are placed in: a position, F, between the object plane position, C, and a first multi-polar Wien filter 102; a position, G, between the first multi-polar Wien filter 102 and the intermediate image-formation plane position (½ plane position), D; a position, H, between the intermediate image-formation plane position, D, and a second multi-polar Wien filter 102'; and a position, I, between the second multi-polar Wien filter 102' and the image plane position, E, in the charged particle beam optical system 101a. The position F and the position G represent the positions symmetric with respect to the ¼ plane position A along the object plane-image plane segment, and the position H and the position I are also placed in the symmetric relationship with respect to the ¾ plane position B along the object plane-image plane segment.

The above-described aberration correction optical apparatus 101b is composed of two multi-polar Wien filters and four unipotential lenses 103b arranged in the physical relationship as described above and serves to compensate for the aberration in the charged particle beam optical system into which the same apparatus is incorporated.

This allows the G trajectory to have a more ideal double symmetry over the first embodiment of the present invention. Further in this configuration, since a deflector can be placed in the intermediate image-formation plane, the load to the power supply can be reduced preferably to the first example of the present invention.

It is to be noted also with this embodiment that each of the unipotential lenses 103a may be constructed in the multi-polar structure by overlapping dipolar or quadrupolar fields to serve for providing axial adjustment and for compensating for a gap resulting from a magnification scale. Although, instead of the unipotential lens 103a, a rotationally symmetric lens or an electromagnetic lens having the multi-polar structure may be employed, the electrostatic type may be more preferably employed from the consideration of the rotational effect on the image. As is the case with the previous embodiment, none of the unipotential lenses are necessarily rotationally symmetric lenses but may be any optical element having the bidirectional focus, including the Wien filters and the electromagnetic prisms.

Figure 14:
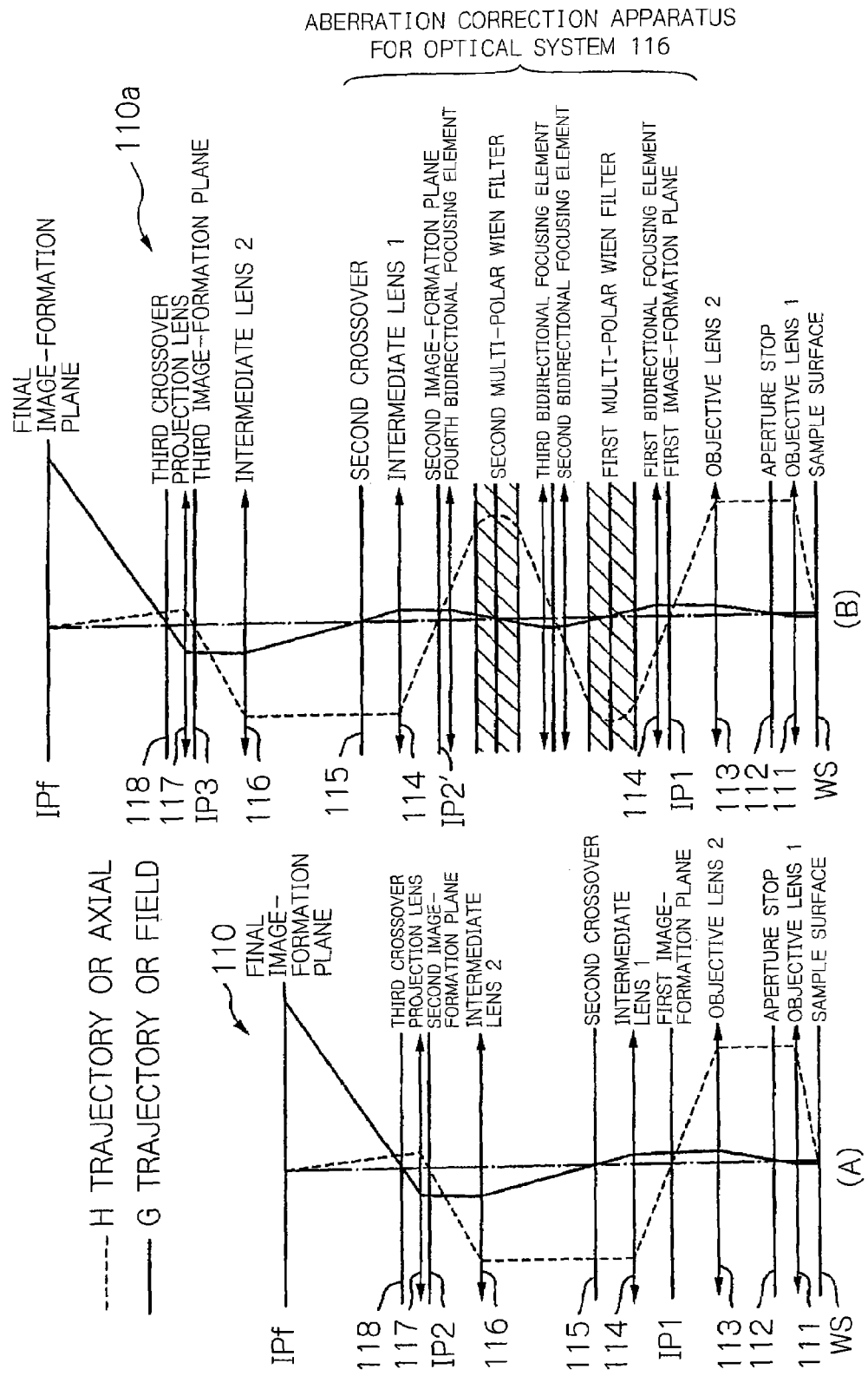
FIG. 14(A) shows a schematic view of a typical image projection optical system according to the conventional technology.
FIG. 14(B) shows a schematic view of an image projection optical system according to the present invention incorporated with an aberration correction optical apparatus shown in FIG. 13.

With reference to FIG. 14, there will now be described an example in which the aberration correction optical apparatus 101b according to the second embodiment among the above-described aberration correction optical apparatuses is applied to an image projection optical system representing one type of the charged particle beam optical system.

In FIG. 14, for comparison, (A) in the left side shows a common image projection optical system 110 according to a conventional technology comprising no aberration correction optical system in a schematic diagram and (B) in the right side shows an image projection optical system 110a comprising the aberration correction optical apparatus 101b also in a schematic diagram. In FIG. 14, reference character/numeral WS designates a sample surface, 111 a first objective lens, 112 an aperture stop, 113 a second objective lens, IP1 a first image-formation plane, 114 a first intermediate lens, 115 a second crossover lens, 116 a second intermediate lens, IP2 a second image-formation plane, 117 a projection lens, 118 a third crossover lens and IP3 a final image-formation plane, respectively.

As seen from the comparison between FIG. 14 (A) and (B), the aberration correction optical apparatus 101b is incorporated by inserting it into the conventional image projection optical system 101 that has been separated in the site corresponding to the first image-formation plane IP1 of the optical system, in such a manner that the object plane position C is in alignment with the position of the first image-formation plane IP1 and the image plane position E of the aberration correction optical apparatus is in alignment with the position of the second image-formation plane IP2', or the position corresponding to the first image-formation plane IP1 in the conventional image projection optical system 110. Since the aberration correction optical apparatus in itself is of equally scaled image forming, in which neither the magnifying scale or the aperture angle would vary, therefore it is not necessary at all for the conventional image projection optical system to modify the image forming condition. It is to be noted that the second image-formation plane IP2 of the conventional image projection optical system corresponds to a third image-formation plane IP3 in the image projection optical system of the present invention.

The optical aberration in the image projection optical system during the image-formation of the secondary electrons emanating from the sample surface WS is prominent in an axial chromatic aberration from the objective lens resulting from the expansion of the energy of electrons, and so the aberration correction optical system may be conditioned to generate such an axial chromatic aberration in an equivalent volume but with an opposite sign that can cancel the axial chromatic aberration that would be introduced by the objective lens.

With reference to FIG. 15, there will now be described an example in which the aberration correction optical apparatus 101b according to the second embodiment among the above-described aberration correction optical apparatuses is applied to an image projection optical system representing one type of the charged particle beam optical system.

In FIG. 15, for comparison, (A) in the left side shows a common scanning type optical system 120 according to the conventional technology comprising no aberration correction optical system in a schematic diagram and (B) in the right side shows a scanning type optical system 120a comprising the aberration correction optical apparatus 101b also in a schematic diagram. In FIG. 15, reference character/numeral 121 designates an electron gun, 122 a condenser lens, IP5 a first image-formation plane, 123 an intermediate lens, IP6 a second image-formation plane, 124 an objective lens and WS a sample surface, respectively.

As seen from the comparison between FIGS. 15(A) and (B), the aberration correction optical apparatus 101b is incorporated by inserting it into the conventional optical system that has been separated in the site corresponding to the intermediate image-formation plane of a front stage of an objective lens, or the position of the second image-formation plane IP5 in the illustration, in such a manner that the object plane position C is in alignment with the second image-formation plane IP5 and the image plane position E of the aberration correction optical apparatus is in alignment with the third image-formation plane IP7, or the second image-formation plane IP6 in the conventional scanning type optical system. Since the aberration correction optical apparatus in itself is of equally scaled image forming, in which neither the magnifying scale nor the aperture angle would vary, it is not necessary for the conventional scanning type optical system to modify the image forming condition.

The optical aberration in the scanning type optical system is prominent in a spherical aberration, an axial chromatic aberration and a diffractive aberration from the objective lens, and so the aberration correction optical system provided for compensating for the aberration may be conditioned to generate such a spherical aberration and an axial chromatic aberration in an equivalent volume but with an opposite sign that can cancel the spherical aberration and the axial chromatic aberration that would be introduced by the objective lens. Further, by way of this, the conditioning of the scanning type optical system may be modified to have a relatively low diffractive aberration but relatively high spherical and axial chromatic aberrations over the conventional system, to thereby provide further improvement in the optical aberration for an entire unit including the correction optical apparatus.

In this regard, the scanning type optical system typically provides a two-dimensional scanning over the sample surface with a narrowly converged charged particle beam, and the deflector section for the scanning may be disposed in the optical system incorporated with the aberration correction optical apparatus in the optical trajectory at a location downstream to the image plane of the aberration correction optical apparatus and upstream to the principal plane of the objective lens.

INDUSTRIAL APPLICABILITY

An aberration correction optical apparatus of the present invention is applicable to an electronic microscope, an electron beam inspection apparatus and the like which use a charged particle beam.

What is claimed is:

1. An aberration correction optical apparatus for a charged particle beam optical system, comprising:
   two identically sized multi-polar Wien filters arranged such that their centers are aligned with a ¼ plane position and a ¾ plane position, respectively, along an object plane-image plane segment in said aberration correction optical apparatus; and
   optical elements having bidirectional focus disposed in an object plane position, an intermediate image-formation plane position and an image plane position in said aberration correction optical apparatus.

2. An aberration correction optical apparatus for a charged particle beam optical system, comprising:
   two identically sized multi-polar Wien filters arranged such that their centers are aligned with a ¼ plane position and a ¾ plane position, respectively, along an object plane-image plane segment in said aberration correction optical apparatus; and
   a plurality of optical elements having bidirectional focus disposed on both sides of each of said Wien filters with respect to the traveling direction of said charged particle beam in a symmetric configuration relative to the center of each of said Wien filters such that a distance between said centers of said wien filters is shorter than a distance between an object plane position or an image plane position and an intermediate image-formation position.

3. An aberration correction optical apparatus for a charged particle beam optical system according to claim 1 or 2, wherein said optical element is a rotationally symmetric lens.

4. An aberration correction optical apparatus for a charged particle beam optical system according to claim 1 or 2, wherein said optical element is a multi-polar lens.

5. An aberration correction optical apparatus for a charged particle beam optical system according to claim 1 or 2, wherein said optical element is the Wien filter.

6. An aberration correction optical apparatus for a charged particle beam optical system according to claim 1 or 2, wherein said optical element is an electromagnetic prism.

7. An image projection optical system for guiding a charged particle beam emanating from a sample surface to a final image-formation plane, wherein an aberration correction optical apparatus according to claim 1 or 2 is arranged in a first image-formation plane between an objective lens and an intermediate lens in said image projection optical system such that said first image-formation plane is in alignment with an image plane position in said aberration correction optical apparatus.

8. A scanning type optical system for guiding a charged particle beam emanating from a charged particle beam source to a sample surface, wherein an aberration correction optical apparatus according to claim 1 or 2 is disposed in an intermediate image-formation plane of a front stage of an objective lens in said scanning type optical system.

* * * * *